United States Patent
Guo et al.

(10) Patent No.: US 12,043,897 B2
(45) Date of Patent: Jul. 23, 2024

(54) COATING DEVICE AND CARRIER SEAT THEREOF

(71) Applicant: PIOTECH INC., Shenyang (CN)

(72) Inventors: Yue Guo, Shenyang (CN); Chun Liu, Shenyang (CN); Ziyou Liu, Shenyang (CN); Zhuo Wang, Shenyang (CN); Jingshu Li, Shenyang (CN)

(73) Assignee: PIOTECH INC., Shenyang (CN)

( * ) Notice: Subject to any disclaimer, the term of this patent is extended or adjusted under 35 U.S.C. 154(b) by 233 days.

(21) Appl. No.: 17/550,522

(22) Filed: Dec. 14, 2021

(65) Prior Publication Data

US 2022/0205092 A1 Jun. 30, 2022

(30) Foreign Application Priority Data

Dec. 31, 2020 (CN) .......................... 202011627010.X

(51) Int. Cl.
*C23C 16/458* (2006.01)
*C23C 16/44* (2006.01)
*C23C 16/455* (2006.01)

(52) U.S. Cl.
CPC ...... *C23C 16/4583* (2013.01); *C23C 16/4401* (2013.01); *C23C 16/45544* (2013.01)

(58) Field of Classification Search
CPC ............ C23C 16/4583; C23C 16/4401; C23C 16/45544; C23C 16/4409; C23C 16/4412; C23C 16/45521; C23C 16/45563; C23C 16/4586; C23C 16/4581; C23C 16/52; C23C 16/455

USPC ......................................................... 118/729
See application file for complete search history.

(56) References Cited

U.S. PATENT DOCUMENTS

| | | | |
|---|---|---|---|
| 2003/0089698 A1* | 5/2003 | Ratliff | C23C 16/4584 219/390 |
| 2005/0193952 A1* | 9/2005 | Goodman | H01L 21/68735 118/728 |
| 2007/0137794 A1* | 6/2007 | Qiu | C23C 16/4584 118/725 |
| 2007/0187386 A1* | 8/2007 | Kim | H01L 21/324 219/385 |
| 2015/0152555 A1* | 6/2015 | Mai | H01L 21/6776 118/723 R |

FOREIGN PATENT DOCUMENTS

| | | | |
|---|---|---|---|
| JP | 2003045808 A | * | 2/2003 |
| JP | 2003203868 A | * | 7/2003 |

\* cited by examiner

*Primary Examiner* — Aiden Lee
(74) *Attorney, Agent, or Firm* — Locke Lord LLP; Tim Tingkang Xia, Esq.

(57) ABSTRACT

The present invention discloses a coating device including: a first shell, having a top portion and a side portion; and a second shell, accommodated in the first shell and at least partially divergently extending downwards from the top portion of the first shell. The first shell and the second shell define a first space in between, the second shell defines a second space, and the first space surrounds the second space and the two are not in communication.

9 Claims, 3 Drawing Sheets

US 12,043,897 B2

COATING DEVICE AND CARRIER SEAT THEREOF

CROSS-REFERENCE TO RELATED APPLICATIONS

This non-provisional application claims priority under 35 U.S.C. § 119(a) to Patent Application No(s). 202011627010.X filed in China on Dec. 31, 2020, the entire contents of which are hereby incorporated by reference.

BACKGROUND OF THE INVENTION

Field of the Invention

The present invention relates to a coating device, and more particularly to vapor deposition device suitable for three-dimensional samples.

Description of the Prior Art

A vapor deposition processing device, particularly when applied for forming a film (for example, an atom deposition layer (ALD)) on a block object (for example, a lens), usually encounters some issues, such as an undesired film being formed on a back surface of the block object. The reason for the above is that the non-deposition back surface of the block object is not necessarily a plane, and a gap is presented between the block object and a carrier surface, such that a deposited gas flows through the gap to the back surface of the block object. Moreover, due to a certain volume of the block object, a processing cavity required also needs to have a sufficient space for accommodating the block object, and hence the capability for cleaning the cavity also needs to increase. In addition, as the space of the cavity is increased, temperature control for the cavity, such as temperature distribution uniformity and the speed of heat dissipation, has also become a challenge.

Therefore, there is a need for a vapor deposition device for improving the issues above.

SUMMARY OF THE INVENTION

It is an object of the present invention to provide a coating device including: a first shell, having a top portion and a side portion; and a second shell, accommodated in the first shell and at least partially divergently extending downwards from the top portion of the first shell. The first shell and the second shell define a first space in between, the second shell defines a second space, and the first space surrounds the second space and the first space and the second space are not in flow communication with each other.

In a specific embodiment, the second shell has a top portion and a bottom portion, the top portion of the second shell has a diameter, the bottom portion of the second shell has a diameter, and a diameter of the second shell increases in a direction from the top portion to the bottom portion.

In a specific embodiment, the side portion of the first shell is provided with a wall mount, and the bottom portion of the second shell sits on the wall mount.

In a specific embodiment, the first space is maintained in an atmospheric pressure, and the second space is used as a reaction region for coating.

In a specific embodiment, the top portion of the second shell has a gas channel, and a downstream of the gas channel is provided with a gas barrier plate for dispersing a gas.

It is another object of the present invention to provide a carrier seat for carrier a coated object and configured to ascend and descend in a first shell. The carrier seat includes: a support post, having a top portion and configured to provide a gas from the top portion; and a carrier plate, connected to the top portion of the support post, and having an upward facing surface and a support portion extending upwards from the upward facing surface and for supporting the object, wherein the upward facing surface has at least one air inlet configured to supply the gas and a plurality of vents extending from the upward facing surface towards an outer side of the carrier plate. The upward facing surface, the support portion and the object define an exhaust path therebetween. The gas flows from the air inlet to the vents through the exhaust path.

In a specific embodiment, the support portion has a gasket, and an inner side of the gasket has an inclined surface for contacting the object.

In a specific embodiment, between the support portion and the upward facing surface is an inclined surface.

In a specific embodiment, the support portion has a plate, and the plate has a plurality of hollows formed thereon for accommodating a plurality of objects.

In a specific embodiment, the support post has a sealing plate, a side portion of the first shell is provided with a wall mount, and the sealing plate is configured to contact the wall mount when the support post is located at a height such that the carrier seat enters a reaction region sealed by the sealing plate.

BRIEF DESCRIPTION OF THE DRAWINGS

The above and other features and advantages of the present invention will become more apparent in the embodiments described with the accompanying drawings below.

Figure 1:
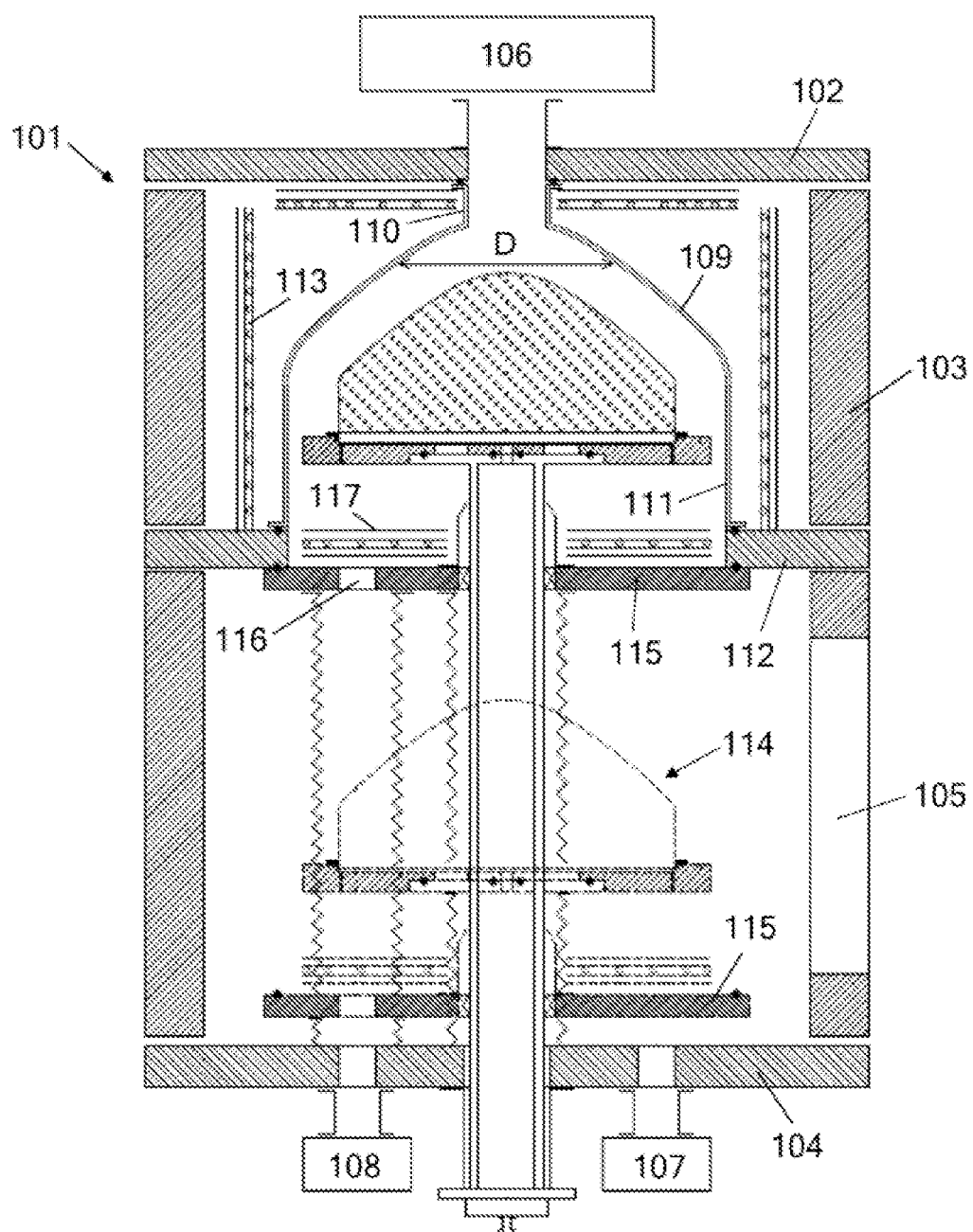
FIG. 1 is a schematic diagram of a coating device of the present invention.

In the drawings, 101: first shell; 102: top portion; 130: side portion; 104: bottom portion; 105: opening; 106: inlet unit; 107: exhaust unit; 108: exhaust unit; 109: second shell; 110: top portion; 111: bottom portion; 112: 113: heating unit; 114: carrier seat; 115: bottom plate; 116: hole; 117: heating unit; 200: carrier seat; 201: support post; 202: carrier plate; 203: upward facing surface; 204: support portion; 205: gasket; 206: vent; 300: carrier seat; 304: support portion; 400: carrier seat; 403: upward facing surface; 404: support portion; 405: plate; 500: second shell; 501: gas barrier plate; 600: second shell; 700: second shell; L: object; D: diameter.

DETAILED DESCRIPTION OF THE EMBODIMENTS

In the detailed description of the various exemplary embodiments below, reference is made to the accompanying drawings that form a part of the present invention. It is to be understood that the embodiments are given by way of examples, and the implementation of these specific embodiments can be carried out on the basis of the description of the examples. Thus, sufficient details are given for a person skilled in the art to perform the specific embodiments. Moreover, it is to be understood that, other specific embodiments can be used and other modifications can be made without departing form the spirit or scope of the specific embodiments. In addition, the reference to "a specific embodiment" does not need to belong to the same or such single specific embodiment. Thus, the detailed description below is not to be construed as limitations, and the scope of the specific embodiments described are to be accorded with the definition of the appended claims.

Throughout the application and the claims, unless otherwise explicitly specified in the context, the terms used below contain meanings associated with the explanations given below. When in use, unless otherwise explicitly specified, the term "or" is used to include "or", and the term is equivalent to "and/or". Unless otherwise explicitly specified in the context, the term "according to" is non-exclusive, and allows accordance with numerous other factors not described herein. Moreover, throughout the application, meanings of "a", "an" and "the" include references of plural forms. The meaning of "in . . . " includes "in . . . " and "on . . . ".

The description below provides a brief summary of the innovative subject matter to provide fundamental understanding for certain implementations. The summary given is not expected to serve as a comprehensive overview. Moreover, the summary is not expected to serve for identifying main or critical elements, or for describing or narrowing the range. The object of the summary is to present certain concepts by a brief form, and to act as a prelude of the more detailed description that follows.

FIG. 1 shows a coating device according to an embodiment of the present invention. The coating device includes a first shell 101 having a top portion 102, a side portion 103 and a bottom portion 104. The side portion 103 of the first shell 101 is provided with an opening 105, which is connected to a transmission cavity (not shown) via a movable valve (not shown) so as to receive an object to be coated or unload a processed object. A chemical vapor deposition is performed in the first shell 101. The top portion 102 of the first shell 101 is provided with an inlet unit 106 for providing the first shell 101 with a reactive gas or a cleaning gas. The bottom portion 104 of the first shell 101 is connected to a plurality of exhaust units 107 and 108, which respectively control air pressures in different spaces in the first shell 101.

A second shell 109 is fixedly accommodated in the first shell 101. The second shell 109 has a top portion 110 and a bottom portion 111. The top portion 110 of the second shell 109 is connected to the top portion 102 of the first shell 101, and the second shell 109 divergently extends from the top portion 110 to the bottom portion 111; that is, the top portion 110 of the second shell 109 has a diameter, the bottom portion 111 of the second shell 109 has a diameter, and thus a diameter D of the second shell 109 increases in a direction from the top portion 110 to the bottom portion 111. In other words, the second shell 109 is shaped as being narrower on an upper half and wider on the lower half. In one embodiment, the bottom portion 111 of the second shell 109 is connected to the side portion 103 of the first shell 101. The top portion 110 of the second shell 109 has a gas channel, which passes through the top portion 102 of the first shell 101 and has an upstream thereof coupled to the inlet unit 106. The side portion 103 of the embodiment shown is provided with a wall mount 112, and the bottom portion 111 of the second shell 109 is connected to an upper surface of the wall mount 112. The connection between the second shell 109 and the first shell 101 is a sealed connected. For example, an O ring is provided between the top portion 102 of the first shell 101 and the top portion 110 of the second shell 109, and another O ring is provided between the wall mount 112 of the first shell 101 and the bottom portion 111 of the second shell 109. Thus, a first space is defined between the first shell 101 and the second shell 109, and the space is maintained at an atmospheric pressure. In the first space, one or more heating units 113 may be provided for heating the second shell 109.

A carrier seat 114 is configured to ascend and descend in the first shell 101. As shown, the carrier seat 114 is movable between a highest position and a lowest position (indicated by the dotted line). The carrier seat 114 includes a bottom plate 115, which moves as the carrier seat 114 ascends or descends. When the carrier seat 114 ascends to the highest position, the bottom plate 115 tightly contacts with a lower surface of the wall mount 112. An O ring is provided between the wall mount 112 and the bottom plate 115, such that the two are also in a sealed contact. At this point, the second shell 109 and the bottom plate 115 define a second space.

As shown, the sealed contact between the wall mount 112 and the bottom plate 115 divides the first shell 101 into an upper half part and a lower half part including the first space and the second space. The space of the lower half part is a transitional space for an object to stay temporarily. When the carrier seat 114 ascends in a way that the bottom plate 115 forms a sealed contact with the wall mount 112, the second space is not in communication with the transitional space below the bottom plate 115, and the two have independent pressures. The sealed second space is primarily used as a reaction region for a coating process. When the carrier seat 114 descends to the lowest position, the bottom plate 115 leaves the wall mount 112 such that the second space becomes in communication with the transitional space below, and the second space at this point does not satisfy the condition for serving as a reaction region.

Although not shown, it is to be understood that, in other embodiments, the ascended bottom plate 115 may be configured to be a sealed contact with the second shell 109 so as to form a reaction region. Alternatively, the ascended bottom plate 115 may also be configured to be in a sealed contact with the side portion 103 of the first shell 101 to form a reaction region. That is, by using appropriate sealing means, a reaction region can be constructed and implemented in the absence of the wall mount 112.

The material of the first shell 101 may be ceramic (for example, $Al_2O_3$), or may be other materials having a smaller coefficient of expansion, so that the first shell 101 may serve as an insulation layer to withstand high temperatures from the reaction region or the heating unit 113. An outer side of the first shell 101 may be coated by a high thermal conductivity material, allowing heat generated by the heating unit 113 to be more easily transferred to the second shell 109. The first space defined by the first shell 101 and the second shell 109 is maintained at an atmospheric pressure. The reaction region defined by the second shell 109, the wall mount 112 and the bottom plate 115 is controlled to be a vacuum environment suitable for implementing coating. The transitional space defined by the wall mount 112, the ascended bottom plate 115 and the bottom portion 104 of the first shell 101 is controlled to be a vacuum environment to prevent the coated object from contamination. The pressure of the transitional space is controlled by an exhaust unit 107, and the pressure of the reaction region is controlled by another exhaust unit 108. As shown, the bottom plate 115 has a hole 116, and any residual gas in a reaction cavity is discharged through a hole 116 to the exhaust unit 108. Another heating unit 117 may be provided above the bottom plate 115 to control the temperature below the reaction region.

In the coating device of the present invention, the space of the reaction region defined by the second shell can be relatively decreased, as the second shell has a dilated shape similar to a funnel, and this helps cleaning efficiency after the coating process. Moreover, since the first space defined between the first shell and the second shell is maintained at an atmospheric pressure, the efficiency of heat conduction of the heat generated by the heating unit accommodated therein to the reaction region is better than that in a vacuum environment, and this helps the temperature control of the reaction region.

Figure 2:
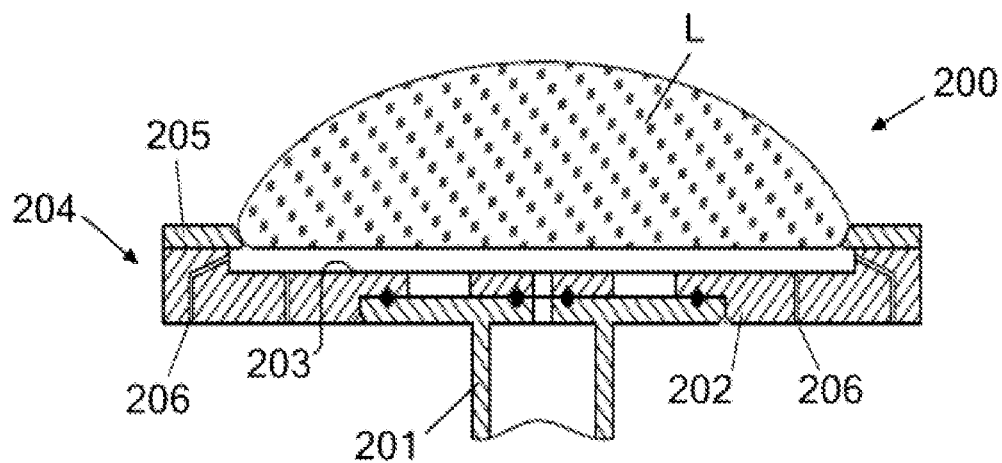
FIG. 2 is a carrier seat according to an embodiment of the present invention.

FIG. 2 shows a carrier seat according to an embodiment of the present invention. A carrier seat 200 includes a support post 201 and a carrier plate 202. The support post 201 extends vertically from the bottom portion 104 of the first shell 101 and is connected to the bottom plate 115, as shown in FIG. 1. A bottom portion of the support post 201 is connected to a driving unit (not shown). The support post 201 has a top portion opposite to the bottom portion, wherein the top portion is in a sealed connection with a bottom portion of the carrier plate 202. For example, the top portion of the support post 201 may have a combination of a planar surface or an inclined surface. At least one O ring may be provided between the top portion of the support post 201 and the bottom portion of the carrier plate 202 to implement the sealed connection. The carrier plate 202 has an upward facing surface 203, which is substantially a flat surface. The carrier plate 202 further has one or more support portions 204 for supporting an object L to be coated and the support portions extend upwards from the upward facing surface 203. As shown in the drawing, the support portion 204 surrounds a periphery of the upward facing surface 203, such that the support portions 204 and the upward facing surface 203 define a recessed space. In other possible embodiments, the carrier plate 202 may include a plurality of support portions 204 with different heights to match the shape of an object to be coated.

A top surface or a surface of the support portion 204 may be provided with a gasket 205, which may be made of a material the same as or different from that of the carrier plate 202, for example, ceramic. An inner side of the gasket 205 may be formed as an inclined surface to serve as a contact surface with the object L. The size of the gasket 205 is appropriately selected so as to at least not shield an upper surface to be coated of the object L. As shown, the placed object L, the support portion 204 and the upward facing surface 203 define a gap, which does not welcome the entering of a reactive gas.

A body of the support post 201 is provided with an inlet tube for an inert gas and extending to a vent of on the top portion of the support post 201, such that the top portion of the support post 201 may provide the inert gas. The carrier plate 202 is provided with an air inlet at a position corresponding to the support post 201, for the inert gas to pass through the upward facing surface 203 of the carrier plate 202 and be released into the gap and fill the gap. The carrier plate 202 further includes a plurality of vents 206, which extend from the upward facing surface 203 towards an outer side of the carrier plate 202 or extend outwards from an inner side of the support portion 204. Thus, when the carrier seat 200 is sealed in the reaction cavity, the vacuum environment of the reaction cavity forces the inert gas provided on the carrier seat 200 to flow through the vents 206 to the reaction region and be further discharged from the reaction region by the exhaust unit 108. Thus, a lower part of the object L at least has an exhaust path defined by the upward facing surface 203, the support portion 204 and the object L. In practice, during the coating process, it is still possible that some deposited particles may enter the lower part of the object from between the object L and the support portion 204 and be deposited on a lower surface of the object L. The exhaust path is capable of preventing the undesired deposition on the back surface. The particles passed through can be blown by the inert gas to an edge of the upward facing surface 203 and return to the reaction region through the vents 206. Thus, the cleanliness of the back surface of the object can be maintained, and such effect is particularly helpful for improving the production yield rate of lenses.

Figure 3:
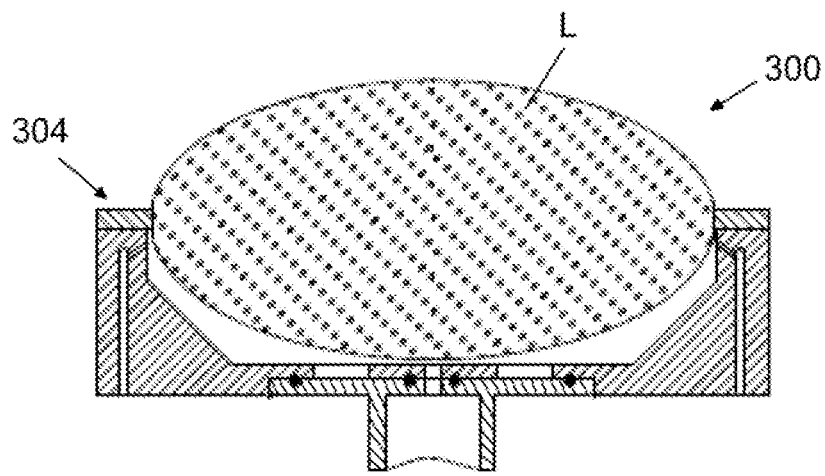
FIG. 3 is a carrier seat according to another embodiment of the present invention.
Figure 4:
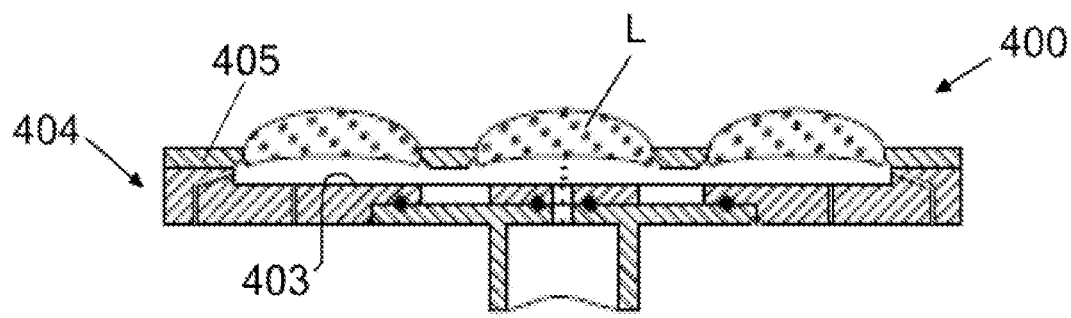
FIG. 4 is a carrier seat according to yet another embodiment of the present invention.

FIG. 3 shows a carrier plate according to another embodiment. A carrier seat 300 includes a support portion 304 that is relatively higher for satisfying the shape of a specific object L. FIG. 4 shows a carrier plate according to another embodiment. When a coating process is applied to a plurality of small-sized objects L, a top portion of a support portion 404 of a carrier seat 400 is provided with a plate 405, which has a plurality of hollows for placing the plurality of objects L. A lower surface of the plate 405 and an upward facing surface 403 define an exhaust path, which passes below these objects L so as to blow off unwanted deposited particles.

Figure 5:
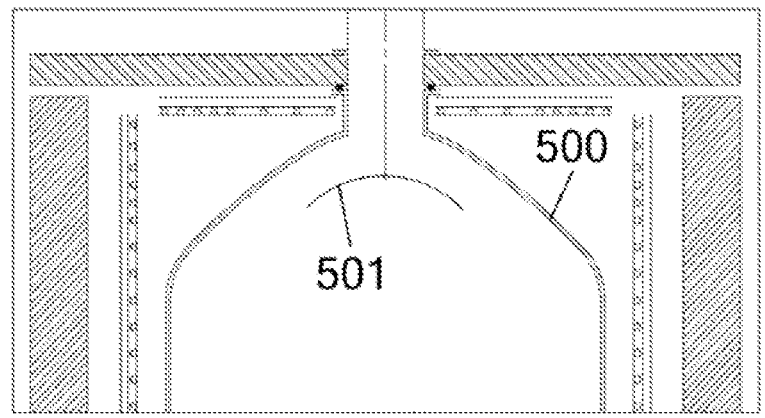
FIG. 5 is a reaction region according to an embodiment of the present invention.
Figure 6:
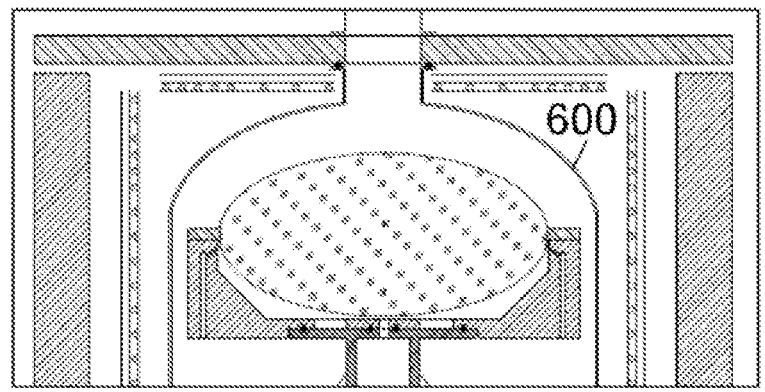
FIG. 6 is a reaction region according to another embodiment of the present invention.
Figure 7:
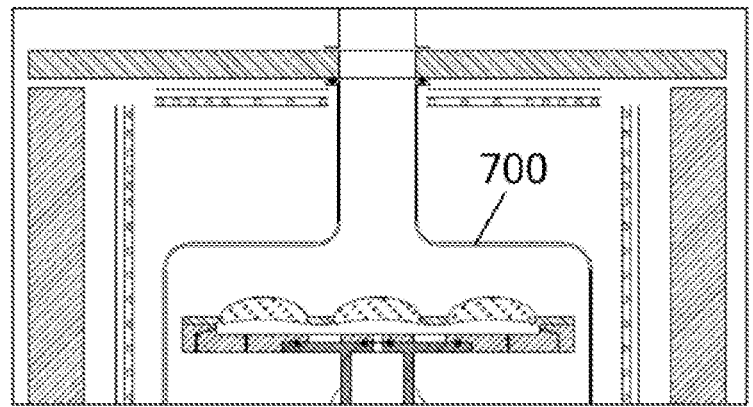
FIG. 7 is a reaction region according to yet another embodiment of the present invention.

FIG. 5 shows a reaction region according to an embodiment. A downstream of a gas channel on a top end of a second shell 500 defining the reaction region is provided with one or more gas barrier plates 501 for dispersing a gas and for determining a flow direction of deposited gas. In one embodiment, the gas barrier plate 501 may be replaced by a multi-pore showerhead plate. FIG. 6 shows a reaction region according to another embodiment. A second shell 600 defining the reaction region is configured as a curved structure matching the shape of a curved object L. FIG. 7 shows a reaction region according to yet another embodiment of the present invention. A second shell 700 defining the reaction region is configured to have a flat top portion matching an array of the object L, and this helps minimize the volume of the object L or helps produce a uniform deposition.

The disclosure above provides comprehensive description of the manufacturing and use of combinations of the specific embodiments. Various other embodiments can be formed without departing from the spirit and scope of the disclosure above, and therefore these embodiments are to be encompassed within the scope of the appended claims.

What is claimed is:

1. A coating device, comprising:
a first shell having a top portion and a side portion, the top portion coupled to an inlet unit;
a second shell accommodated in the first shell and at least partially divergently extending downwards from the top portion of the first shell; and
a carrier seat for carrying an object to be coated and configured to move between a highest position and a lowest position in the first shell, the carrier seat comprising:
a support post having a top portion and configured to provide a gas from the top portion of the support post;

a carrier plate connected to the top portion of the support post and having an upward facing surface with a support portion extending upwards from the upward facing surface for supporting the object to be coated, and a bottom plate;

wherein the first shell and the second shell define a first space, and when the carrier seat moves to the highest position, the second shell and the bottom plate define a second space as a reaction region for coating process, and the first space surrounds the second space and the first space and the second space are not in flow communication with each other.

2. The coating device according to claim 1, wherein the second shell has a top portion and a bottom portion, and a diameter of the second shell increases in a direction from the top portion of the second shell to the bottom portion of the second shell.

3. The coating device according to claim 2, wherein the side portion of the first shell has a wall mount, and the bottom portion of the second shell sits on the wall mount.

4. The coating device according to claim 1, wherein the first space is maintained at an atmospheric pressure.

5. The coating device according to claim 1, wherein a top portion of the second shell has a gas channel, and a downstream of the gas channel is provided with a gas barrier plate for dispersing another gas.

6. The coating device according to claim 1, wherein the upward facing surface has at least one inlet configured to supply the gas and a plurality of vents extending from the upward facing surface to an outer side of the carrier plate, and the support portion and the object to be coated define an exhaust path between the support portion and the object to be coated, and the gas flows from the inlet to the plurality of vents through the exhaust path.

7. The coating device according to claim 1, wherein the support portion has a gasket, and an inner side of the gasket is provided with an inclined surface for contacting the object.

8. The coating device according to claim 1, wherein an inclined surface is formed between the support portion and the upward facing surface.

9. The coating device according to claim 1, wherein the object to be coated is provided in plural and the support portion has a plate, and the plate has a plurality of hollows formed on the plate for accommodating a plurality of objects to be coated.

* * * * *